United States Patent [19]

Heckman et al.

[11] Patent Number: 5,467,253
[45] Date of Patent: Nov. 14, 1995

[54] SEMICONDUCTOR CHIP PACKAGE AND METHOD OF FORMING

[75] Inventors: James K. Heckman, Tempe; Francis J. Carney, Gilbert; Harry J. Geyer, Phoenix, all of Ariz.

[73] Assignee: Motorola, Inc., Schaumburg, Ill.

[21] Appl. No.: 269,241

[22] Filed: Jun. 30, 1994

[51] Int. Cl.$^6$ ................................................ H05K 1/18
[52] U.S. Cl. ........................ 361/761; 361/765; 361/767; 174/52.2; 174/260; 29/856; 257/698
[58] Field of Search ....................... 361/761, 760, 361/777, 765, 767, 730, 736; 174/52.2, 260, 52.4, 261, 266, 264; 257/684, 678, 687, 693, 698, 787; 29/841, 848, 855, 856

[56] References Cited

U.S. PATENT DOCUMENTS 5,173,766 12/1992 Long et al. .
5,278,726 1/1994 Bernardoni et al. .
5,284,287 2/1994 Wilson et al. .
5,355,283 10/1994 Marrs et al. ............................ 361/760
5,397,917 3/1995 Ommen et al. ......................... 257/698

FOREIGN PATENT DOCUMENTS 1102757 5/1986 Japan ..................................... 257/684

Primary Examiner—Leo P. Picard
Assistant Examiner—Y. Whang
Attorney, Agent, or Firm—Rennie William Dover

[57] ABSTRACT

A semiconductor device having a substrate support (22) and a method of forming the semiconductor device. A substrate (11) has conductive traces (12) and a bonding pad (13) on a bottom surface and conductive traces (14) and a semiconductor chip attach pad (17) on a top surface. The substrate support (22) has an aperture (23) and is coupled to the substrate (11). A semiconductor chip (31) is coupled to the semiconductor chip attach pad (17). The semiconductor chip (31) is covered by an encapsulating material (38) or a cap (41, 51) which provide protection for the semiconductor chip (31).

21 Claims, 2 Drawing Sheets

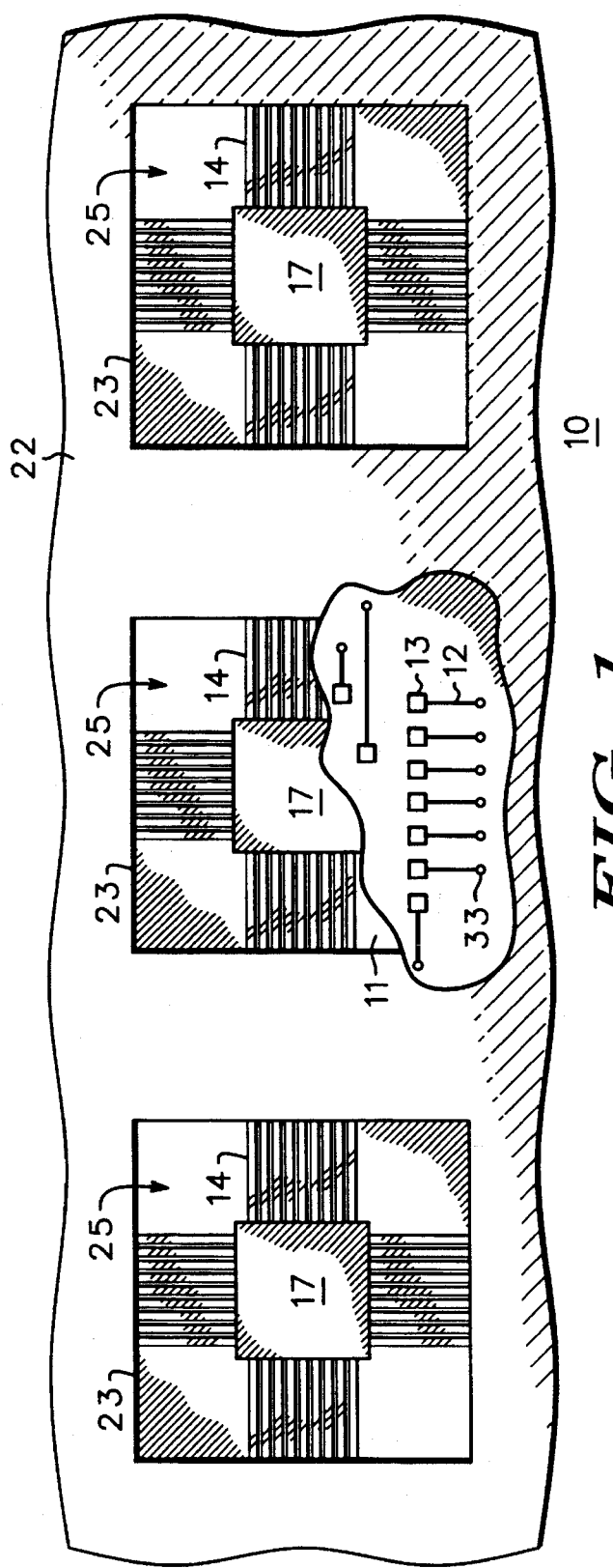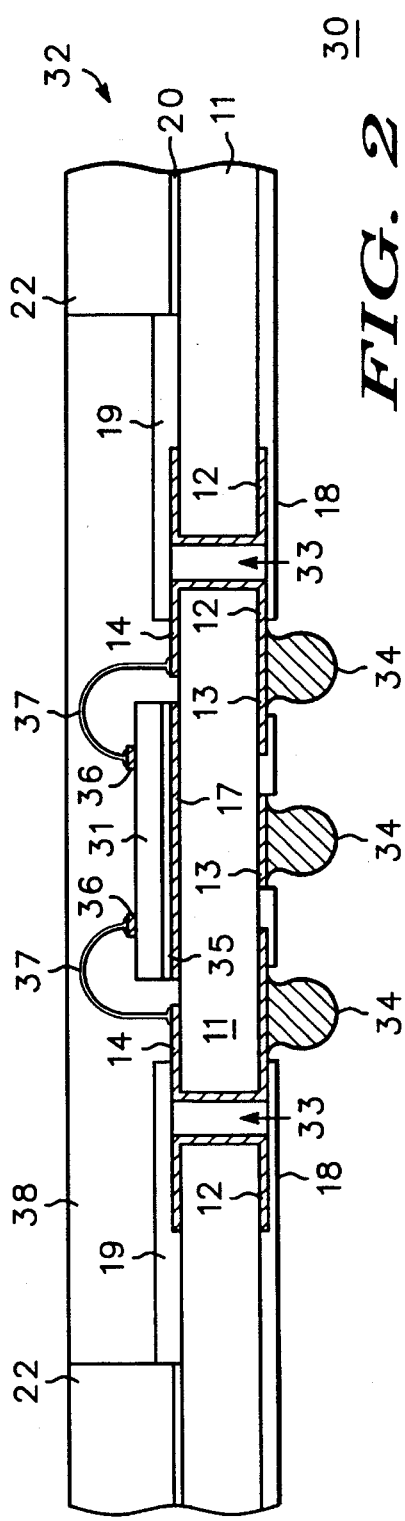

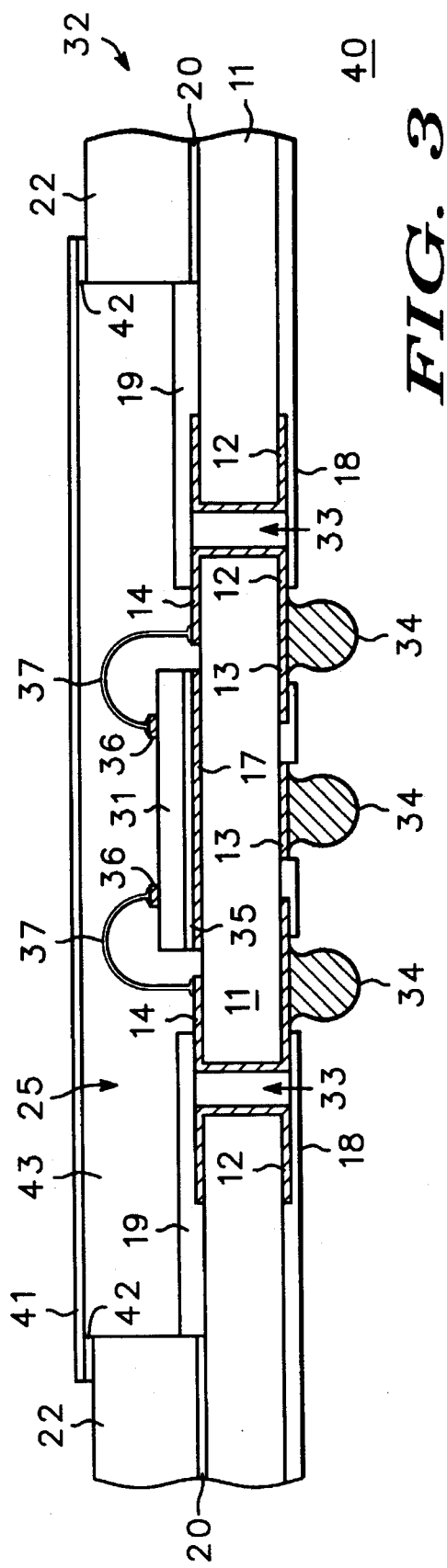
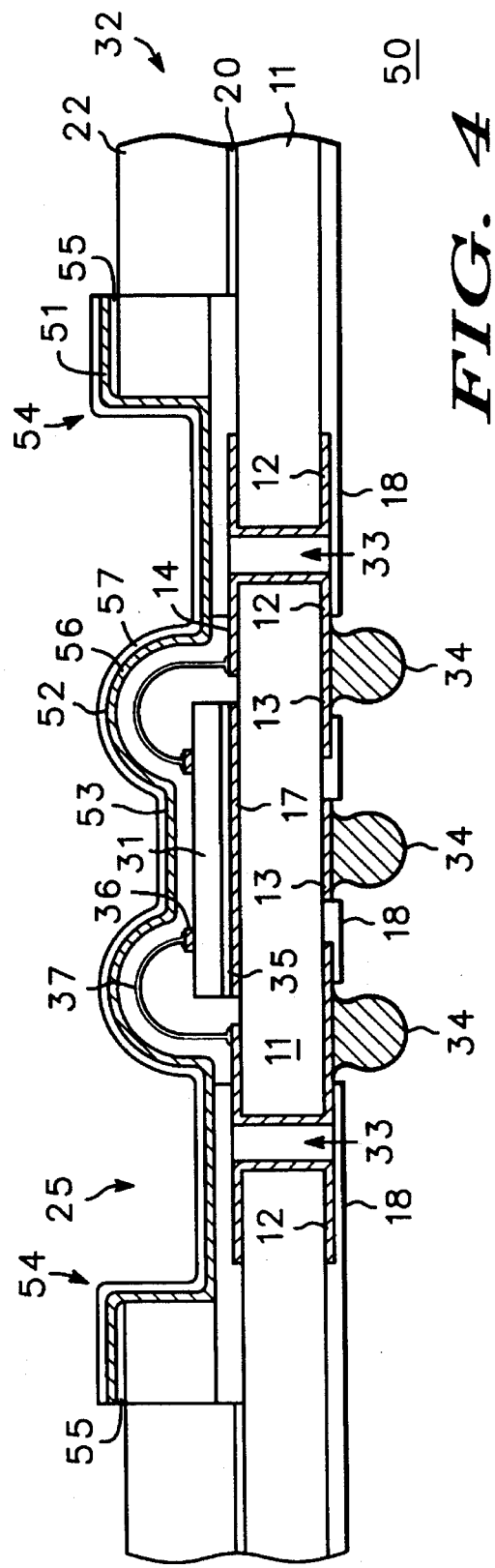

SEMICONDUCTOR CHIP PACKAGE AND METHOD OF FORMING

BACKGROUND OF THE INVENTION

The present invention relates, in general, to semiconductor devices, and more particularly, to semiconductor device packages.

Semiconductor device manufacturers are constantly striving to lower the cost of manufacturing semiconductor devices while improving device electrical and thermal performance characteristics. In addition, it is desirable for the devices to be small, light weight, and have a low profile. Thus, over-molded pad array carrier (OMPAC) semiconductor devices have been developed to improve both the electrical and thermal performance of surface mount semiconductor devices. Typically, OMPAC semiconductor devices include a thin printed circuit board (PCB) substrate on which a semiconductor chip is mounted. Portions of the chip are electrically coupled to conductive traces formed on a top surface of the PCB. Each conductive trace is routed to a corresponding conductive trace on the bottom surface of the PCB by a conductive via which extends through the PCB. The traces on the bottom surface of the PCB each terminate at a conductive pad to form an array of pads on the bottom of the PCB. The semiconductor chip and a portion of the PCB are encapsulated by a molding compound using conventional molding techniques, i.e., placing the PCB having the semiconductor chip mounted thereon in a mold cavity, converting a mold compound from a pellet form to a liquid form, injecting the liquid mold compound into the mold cavity, and curing the mold compound. Although OMPAC semiconductor devices offer the advantages of increased interconnect packaging densities, elimination of coplanarity and skew limitations, low lead inductance, and a low profile, they require a different mold for each type of OMPAC semiconductor device. Since these molds are expensive, manufacturing different types of semiconductor devices is also expensive. In addition, the cost of maintaining molding equipment is high. Further, the mold compounds used in manufacturing OMPAC semiconductor devices require extensive cure times which result in increased cycle times.

Another type of surface mount semiconductor device is a glob-top pad array carrier (GTPAC) semiconductor device. A GTPAC semiconductor device comprises a PCB having a semiconductor chip mounted thereon and a wall or dam of thixotropic material formed on the PCB. The dam surrounds and is spaced apart from the semiconductor chip. Subsequently, the semiconductor chip and the portion of the PCB within the dam are covered by a liquid encapsulant. The dam and the encapsulant form a package body. Although, GTPAC semiconductor packages may offer an increased electrical performance over conventional surface mount packages, they require a thicker PCB to preclude planarity limitations. In addition, the dam material is difficult to dispense and increases cycle time, resulting in higher manufacturing costs.

Accordingly, it would be advantageous to have a method and a means for encapsulating semiconductor chips that does not limit the thickness of the PCB and is readily incorporated into existing manufacturing processes. It would be of further advantage for the method and means to reduce the cost and time required to manufacture semiconductor devices. In addition, it would be advantageous for the method and means to improve the electrical and thermal performance of the semiconductor device.

BRIEF DESCRIPTION OF THE DRAWINGS

FIG. 1 illustrates a partially cut-away top view of a portion of a semiconductor device during processing in accordance with an embodiment of the present invention;

FIG. 2 illustrates a highly enlarged cross-sectional view of a portion of a semiconductor device in accordance with a first embodiment of the present invention;

FIG. 3 illustrates a highly enlarged cross-sectional view of a portion of a semiconductor device in accordance with a second embodiment of the present invention; and FIG. 4 illustrates a highly enlarged cross-sectional view of a portion of a semiconductor device in accordance with a third embodiment of the present invention.

DETAILED DESCRIPTION OF THE DRAWINGS

Generally, the present invention provides a method and a means for encapsulating a semiconductor chip in a recessed ball grid array (BGA) package. In accordance with the present invention, a substrate support having a plurality of apertures is mounted or laminated to a substrate having a plurality of semiconductor chip receiving areas. The substrate support prevents the substrate from warping thereby permitting the use of thin substrates. As those skilled in the art will appreciate, thinner substrates improve the electrical performance of semiconductor devices. A nominal thickness range of substrate used in accordance with the present invention is between approximately 50 microns ($\mu$m) and approximately 1,500 $\mu$m. A semiconductor chip is mounted in each semiconductor chip receiving area and the semiconductor chip is covered. Subsequently, the substrate having the substrate support and the semiconductor chips mounted thereto is singulated into individual semiconductor devices. Techniques for forming individual semiconductor devices are well known and include, for example, cutting, sawing, punching, or the like.

FIG. 1 illustrates a partially cut-away top view of a portion 10 of a semiconductor device during processing in accordance with an embodiment of the present invention. Portion 10 of the semiconductor device comprises a substrate 11 having conductive traces 12 and bonding pads 13 disposed on the bottom surface and conductive traces 14 and chip or die attach pads 17 disposed on a top surface. Chip attach pads 17 serve as semiconductor chip receiving areas. By way of example, conductive traces 12 and 14, bonding pads 13, and chip attach pads 17 are formed by laminating conductive foil to the top and bottom surfaces of substrate 11. Conductive traces 12 and 14, bonding pads 13, and chip attach pads 17 are defined by patterning the conductive foil using lithographic techniques. Alternatively, conductive traces 12 and 14, bonding pads 13, and chip attach pads 17 may be screen printed or otherwise deposited onto surfaces of the substrate. Subsequently, conductive traces 12 and 14, bonding pads 13, and chip attach pads 17 are typically plated with gold or a combination of gold and nickel to form a non-oxidizable surface for wirebonding and attaching solder balls 34 (shown in FIGS. 2–4). Although conductive traces 12 and 14, bonding pads 13, and chip attach pads 17 have been described as comprising two conductive layers, it should be understood that the number of conductive layers and the materials of the conductive layers is not a limitation of the present. It should be further understood that for purposes of clarity conductive traces 12 and 14, bonding pads 13, and chip attach pads 17 are illustrated in FIGS. 2–4 as being a single layer of material throughout the description of the invention.

Conductive vias 33 are typically formed in substrate 11 by drilling or punching holes through the substrate and subsequently plating the holes with a conductive material such as, for example, copper. Other suitable materials for plating the holes include gold, nickel, a combination of gold and nickel, and the like. Thus, only the sidewalls of the holes or vias are conductive, whereas the inner portions are hollow.

The bottom surface, including conductive traces 12 and bonding pads 13, is covered with a layer of solder mask material 18. Likewise, portions of the top surface, including conductive traces 14 and chip attach pads 17, are covered with a layer of solder mask material 19. Suitable solder mask materials include polyimide, high temperature epoxy resins, and the like. Openings or holes (not shown) are formed in solder mask material 18 to expose bonding pads 13, and openings (not shown) are formed in solder mask material 19 to expose chip attach pads 17 and portions of conductive traces 14. Methods for forming conductive traces, bonding pads, chip attach pads, and layers of solder mask material on a substrate are well known to those skilled in the art.

A substrate support 22 having openings or apertures 23 is attached to the top surface of substrate 11. Chip attach pads 17 are exposed through openings 23 when substrate support 22 is attached to the top surface of substrate 11. In other words, substrate support 22 cooperates with substrate 11 to form cavities 25. Substrate support 22 is preferably formed from a resin, such as epoxy, polyimide, triazine, or a phenolic resin. More specifically, a bismaleimidetriazine (BT) resin is preferred. Other suitable materials for substrate support 22 include epoxy-glass composites, printed circuit board (PCB) materials, FR-4, ceramics, and the like. It should be understood that substrate support 22 is an electrically inert substrate, i.e., electrical circuitry is absent from substrate support 22. Substrate support 22 may be attached to substrate 11 by a thermosetting adhesive 20 (FIGS. 2–4) having a low curing temperature such as, for example, Ablebond TM 84-1A, manufactured by Ablestik Laboratories of Rancho Dominguez, Calif. Substrate support 22 serves as a stiffener to maintain the planarity of substrate 11 and to form walls surrounding chip attach pads 14 and 17, i.e., cavities 25. Accordingly, substrate support 22 preferably has a thickness ranging between approximately 125 microns (μm) and approximately 1,250 μm. It should be understood that the thickness of substrate support 22 is not a limitation of the present invention; however, substrate support 22 should be of sufficient thickness so that interconnect wires 37 (FIGS. 2–4) may be covered by an encapsulant filling cavities 25.

FIG. 1 further illustrates that substrate support 22 is a unitary structure having apertures 23 that form cavities 25 when it is coupled to substrate 11.

Now referring to FIG. 2, a highly enlarged cross-sectional view of a first embodiment of a semiconductor device 30 is shown, wherein semiconductor device 30 comprises a semiconductor chip 31 coupled to a BGA package 32. It should be understood that the same reference numerals are used in the figures to denote the same elements. BGA package 32 includes substrate 11 having conductive traces 12 and bonding pads 13 on a bottom surface and conductive traces 14 and a die attach pad 17 on a top surface. Each conductive trace 14 on the top surface is coupled to a corresponding conductive trace 12 on the bottom surface by conductive vias 33. Although the inner portions of conductive vias 33 are shown as being hollow, it should understood that this is not a limitation of the present invention and that conductive vias 33 may be filled with a conductive material. Semiconductor device 30 further includes solder mask layers 18 and 19.

Solder balls 34 are coupled to bonding pads 13 by positioning each solder ball 34 on a corresponding bonding pad 13 in the presence of a flux and performing a solder reflow operation to form a metallurgical bond. Techniques for coupling solder balls to bonding pads are well known in the art. For example, U.S. Pat. No. 5,284,287 entitled "METHOD FOR ATTACHING CONDUCTIVE BALLS TO A SUBSTRATE" issued to Wilson et al., assigned to the same assignee, Motorola, Inc. and which is hereby incorporated herein by reference, teaches a method for coupling a solder ball to a bonding pad. It should be understood that the embodiment illustrated in FIG. 2 is also referred to as a ball grid array (BGA) because solder balls 34 are coupled to bonding pads 13. It should be further understood that the present invention is not limited to having solder balls 34 attached to bonding pads 13. For example, pin grid array (PGA) devices can be formed by attaching pins to bonding pads 13 and land grid array (LGA) devices can be formed by forming silver pads on bonding pads 13.

Semiconductor chip 31 is coupled to chip attach pad 17 via a die attach material 35 such as, for example, a silver filled epoxy. Other suitable die attach materials include rubbers, silicones, polyurethanes, and thermoplastics. Chip bond pads 36 are coupled to corresponding conductive traces 14 via interconnect wires 37. Techniques for coupling semiconductor chips to chip attach pads and wirebonding chip bond pads with conductive traces are well known to those skilled in the art.

In accordance with the first embodiment of the present invention, semiconductor die 31 is covered with an encapsulating material 38. More particularly, encapsulating material 38 fills cavity 25 formed by coupling substrate support 22 to substrate 11. Suitable materials for encapsulating material 38 include a high purity, low stress, liquid encapsulant sold under the trademark Hysol FP4450 or a high purity, liquid epoxy encapsulant sold under the trademark Hysol CNB 648-48 or Hysol CNB 650-51. Preferably, encapsulating material 38 is selected to have a coefficient of thermal expansion that matches the coefficient of thermal expansion of semiconductor chip 31. It should be noted that in accordance with the present invention the amount of encapsulating material 38 in contact with semiconductor chip 31 is greater than the amount of encapsulating material 38 in contact with substrate 11. Thus, to lower thermally induced stresses on semiconductor chip 31, it is desirable to match the coefficient of thermal expansion of encapsulating material 38 to semiconductor chip 31 than to substrate 11. An advantage of matching the coefficients of thermal expansion of encapsulating material 38 and semiconductor chip 31 is that it prevents breakage of wires in contact with semiconductor chip 31.

It should be noted that encapsulating material 38 protects semiconductor chip 31 from moisture, mechanical stresses, contamination, conductive debris, alpha emissions, etc.

FIG. 3 illustrates a highly enlarged cross-sectional view of a semiconductor device 40 in accordance with a second embodiment of the present invention. Semiconductor device 40 comprises a semiconductor chip 31 coupled to an BGA package 32, wherein semiconductor chip 31 is within cavity 25. In accordance with the second embodiment, cavity 25 is filled with a fluid 43 and covered with a cap 41. Preferably fluid 43 is an inert, high-dielectric, thermally conductive material such as silicone. Cap 41 is bonded to semiconductor support 22 using an adhesive material 42. Suitable materials for cap 41 include metal, plastic, and ceramic materials. A suitable material for adhesive material 42 is a thermosetting adhesive having a low curing temperature such as, for example, Ablebond TM 84-1A, manufactured by Ablestik Laboratories of Rancho Dominguez, Calif. Similar to encapsulating material 38 described with reference to FIG. 2, cap 41 covers and protects semiconductor chip 31 from moisture, mechanical stresses, contamination, conductive debris, alpha emissions, etc. Further, it is preferable that the material of cap 41 is selected such that its coefficient of thermal expansion matches that of substrate support 22. Although cavity 25 is shown as being filled with fluid 43, it should be understood that filling cavity 25 with fluid 43 is optional.

FIG. 4 illustrates a highly enlarged cross-sectional view of a semiconductor device 50 in accordance with a third embodiment of the present invention. Semiconductor device 50 comprises a semiconductor chip 31 coupled to a BGA package 32, wherein semiconductor chip 31 is within cavity 25. A portion of cavity 25 is covered with a cap 51. By way of example, cap 51 is bonded to substrate support 22 by an adhesive material 55. More particularly, cap 51 comprises a coined sheet of metal having a raised portion 52 surrounding a central depression 53 and a cap support 54 for bonding to substrate support 22. In other words, cap 51 is formed to have a portion contoured to the shape of substrate support 22, i.e., cap support 54, a portion contoured to the shape of interconnect wires 37, i.e., raised portion 52, and a portion contoured to the shape the surface of semiconductor chip 31, i.e., central depression 53. It should be understood that cap 51 is electrically isolated from interconnect wires 37.

Preferably, the material of cap 51 is selected such that it's coefficient of thermal expansion matches that of substrate support 22. Further, the inductance of interconnect wires 37 and the resonant frequency of semiconductor device 50 can be optimized by forming cap 51 as a bi-metal laminated cap comprising a layer of iron 56 and a layer of aluminum 57. By way of example, iron layer 56 has a thickness of approximately 150 μm and aluminum layer 57 has a thickness of approximately 450 μm. Preferably, layer of iron 56 faces semiconductor chip 31.

By now it should be appreciated that a method and a means have been provided for forming a semiconductor device. The semiconductor device includes a substrate support mounted to a thin substrate having conductive traces formed thereon. The substrate support provides structural strength and serves as a stiffener for the thin substrate. Thus, the substrate support prevents the thin substrate from warping and permits use of thin substrates. For example, the thin substrate having conductive traces may be as thin as a TAB (tape automated bonded) tape, allowing the thin substrate having conductive traces to be processed in rolls. Another advantage of the substrate support of the present invention is that it eliminates the steps of forming dams around each semiconductor chip receiving area. Typically, dam formation requires a large amount of encapsulating material. Another advantage of a thin substrate having conductive traces formed thereon is that the thin substrate facilitates cancellation of inductances of traces on opposing sides of the thin substrate.

Since the encapsulating material is much more expensive than the material used in forming the substrate support, the present invention decreases the cost of manufacturing semiconductor devices. Further, the dams of GTPAC semiconductor devices are made in a sequential fashion, adding to the overall time required to manufacture the semiconductor devices. Since the present invention eliminates dam formation, the cost of materials is reduced and the cycle times for forming the semiconductor devices is decreased. As those skilled in the art are aware, eliminating processing steps inherently results in an increase in yields.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the substrate support may be mounted to multi-layer substrates.

We claim:

1. A semiconductor chip package, comprising:

a substrate having first and second surfaces, the first surface having at least one conductive trace disposed thereon and having a semiconductor chip receiving area, the second surface having at least one bonding pad disposed thereon, the at least one bonding pad coupled to the at least one conductive trace by a via; and a substrate support coupled to the substrate, the substrate support providing structural strength for the substrate and having an aperture exposing the semiconductor chip receiving area, wherein the aperture cooperates with the substrate to form a cavity.

2. The semiconductor chip package of claim 1, wherein a semiconductor chip is coupled to the semiconductor chip receiving area.

3. The semiconductor chip package of claim 2, wherein an encapsulating material covers the semiconductor chip.

4. The semiconductor chip package of claim 2, wherein interconnect wires are bonded to the semiconductor chip and the cavity is covered with a metal cap having a portion that conforms to the shape of the interconnect wires and is electrically separated from the interconnect wires.

5. The semiconductor chip package of claim 1, wherein the cavity is covered by a cap.

6. The semiconductor chip package of claim 5, wherein a material of the cap is selected from the group consisting of ceramic, plastic, and metal.

7. The semiconductor chip package of claim 5, wherein a material of the cap is a bi-metal laminated cap comprising a layer of aluminum and a layer of iron.

8. The semiconductor chip package of claim 5, wherein the cavity contains a fluid.

9. The semiconductor chip package of claim 1, wherein a thickness of the substrate support ranges between approximately 125 microns and approximately 1,250 microns.

10. A semiconductor device package, comprising:

a substrate having top and bottom surfaces, wherein the top surface has a semiconductor chip attach pad and a conductive trace formed thereon and the bottom surface has a bonding pad formed thereon, and wherein a via couples the conductive trace to the bonding pad;

a semiconductor chip mounted to the semiconductor chip attach pad; and a substrate support coupled to the top surface, wherein the substrate support has an aperture and provides structural strength for the substrate, the semiconductor chip exposed through the aperture and the aperture cooperating with the substrate to form a cavity.

11. The semiconductor device package of claim 10, wherein a solder ball is bonded to the bonding pad on the bottom surface.

12. The semiconductor device package of claim 10, wherein a cap covers the aperture.

13. The semiconductor device package of claim 10, wherein an encapsulating material fills the cavity.

14. A method for forming a semiconductor device package, comprising the steps of:

providing a substrate having first and second surfaces, the first surface having a die bonding area and at least one conductive trace disposed thereon and the second surface having at least one bonding pad disposed thereon, the at least one bonding pad coupled to the at least one conductive trace by a via; and attaching a support to the substrate, the support having an aperture aligned to and exposing the die bonding area.

15. The method of claim 14, wherein the step of providing a substrate includes forming a patterned conductive layer on an insulating layer, the patterned conductive layer including the die bonding area.

16. The method of claim 14, wherein the step of providing a substrate includes providing the substrate having a thickness ranging between approximately 50 microns and approximately 1,500 microns.

17. The method of claim 16, wherein the step of attaching a support to the substrate includes attaching a planar support to the substrate, a material for the planar support selected from the group bismaleimidetriazine resin and FR-4.

18. The method of claim 14, wherein the step of attaching a support to the substrate includes coupling the substrate to the support with an adhesive material.

19. The method of claim 14, wherein the step of providing a substrate includes 19 mounting a semiconductor chip to the die bonding area.

20. The method of claim 19, wherein the step of attaching a support to the substrate includes covering the aperture with a cap.

21. The method of claim 19, wherein the step of attaching a support to the substrate includes covering the semiconductor chip with an encapsulation material.

* * * * *